(12) United States Patent
Gomm et al.

(10) Patent No.: US 6,661,717 B1
(45) Date of Patent: Dec. 9, 2003

(54) DYNAMICALLY CENTERED SETUP-TIME AND HOLD-TIME WINDOW

(75) Inventors: Tyler J. Gomm, Meridian, ID (US); Aaron M. Schoenfeld, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 10/158,607

(22) Filed: May 30, 2002

(51) Int. Cl.$^7$ ................................. G11C 7/00
(52) U.S. Cl. .................. 365/194; 365/233; 365/241
(58) Field of Search .................. 365/194, 193, 365/211, 233, 241

(56) References Cited

U.S. PATENT DOCUMENTS 6,028,816 A * 2/2000 Takemae et al. ............. 365/233
6,466,491 B2 * 10/2002 Yanagawa .................. 365/194

* cited by examiner

Primary Examiner—Vanthu Nguyen
(74) Attorney, Agent, or Firm—Williams, Morgan & Amerson, P.C.

(57) ABSTRACT

An apparatus and method for dynamically centering a setup-time and hold-time window. An access window defined by a setup-time and a hold-time is determined. A determination is made whether the access window is centered about a centerline. The centerline is a point between a predetermined setup-time limit and a predetermined hold-time limit. A dynamic access window centering process is performed in response to the determination that the access window is not centered about the centerline. The dynamic access window centering process includes: determining that the access window has shifted from the centerline; and providing at least one of a dynamic delay and a dynamic speed-up of the access window based upon the determination that the access window has shifted from the centerline.

52 Claims, 11 Drawing Sheets

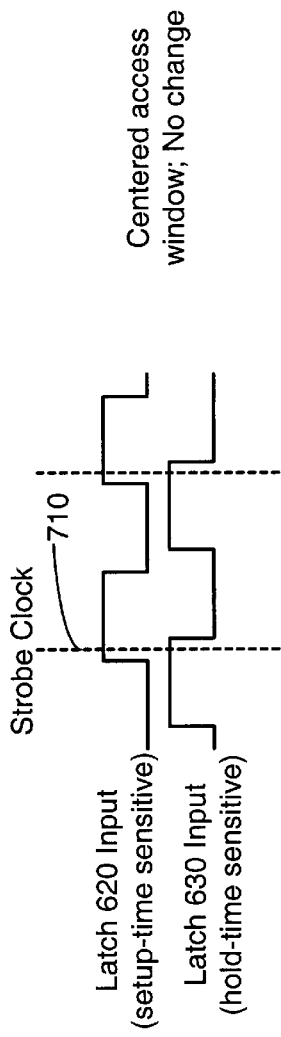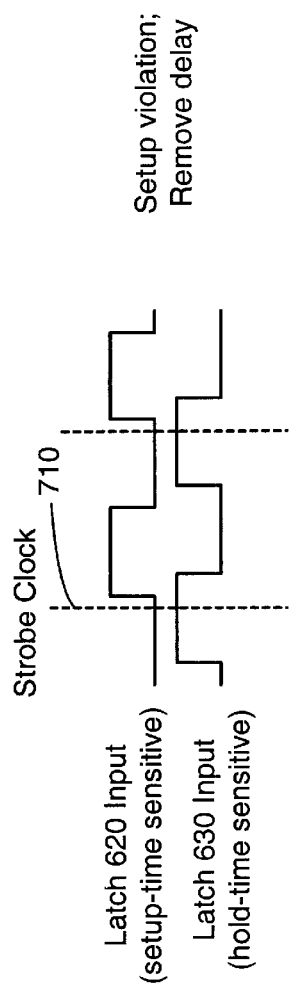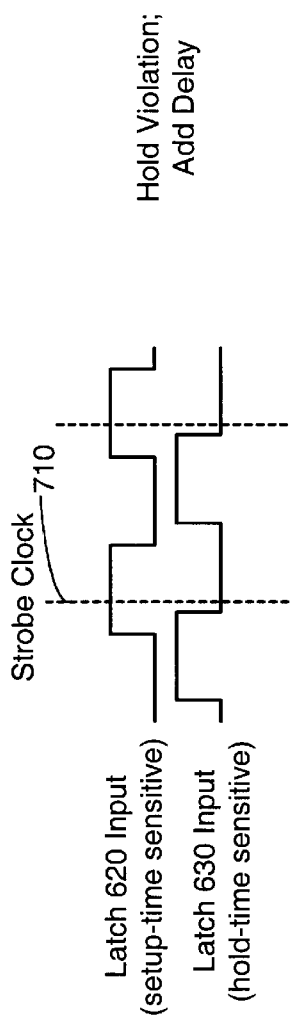

DYNAMICALLY CENTERED SETUP-TIME AND HOLD-TIME WINDOW

BACKGROUND OF THE INVENTION

1. Field of the Invention

This invention generally relates to semiconductor memory devices, and, in particular, to dynamically adjusting a setup-time and hold-time window.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of wordlines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity, may be divided into 64 sub-arrays, each having 256 K ($2^{18}$) memory cells.

Flash memory (sometimes called "flash RAM") is a type of non-volatile memory that can be erased and reprogrammed in units of memory called blocks. Flash memory is a variation of electrically erasable programmable read-only memory (EEPROM) that, unlike flash memory, is erased and rewritten at the byte level, which is slower than flash memory updating. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices. These applications generally call for extensive memory access.

Accessing memory requires a circuit to capture the address and data at precise timing in relation to clock signals that drive a circuit. Errors occurring during the capturing of addresses and data may cause errors in accessing the data stored in memory. Many times external factors, such as temperature drifts, voltage-level drifts, and the like, can affect a window of a time period when data and/or addresses may be captured by a circuit. This window is generally defined by a setup-time and a hold-time, during which the entire process of capturing of data and/or addresses must take place for proper access of data.

In order to acquire, access, or capture data and/or addresses during transfer of memory data from one device to another, clocking of the data and addresses and their timing is desirable. A setup-time and a hold-time are generally used to time the clocking/capturing of data and/or addresses. A setup-time and hold-time is required for the proper timing of data/address capture. To ensure proper access of data/address, a memory accessing system generally works to complete the data/address capture with the window, in which the targeted data/addresses is clock-latched or captured. A window that represents a period of opportunity to latch/clock/capture data or addresses is usually predetermined for the operation of a particular device. For example, a period of time that is enclosed by the boundary defined by a setup-time and a hold-time provides the limits for determining a window of opportunity for capture of data and/or addresses.

FIG. 1 illustrates a diagram of a window of opportunity for capturing data/addresses. The window of opportunity of FIG. 1 is defined by the outer borders comprising a setup-time and a hold-time. The borders defining a time period in which a window of opportunity to capture data/addresses is defined by a specified setup-time boundary/limit 110 and a specified hold-time boundary/limit 120. The limits 110 and 120 define the time frame in which a window can be defined to capture data/addresses.

Operation of typical circuits that drive the capturing of data/addresses usually call for operating on a predetermined normal window of time period in which data can be captured. However, this particular window may slide within the outer limits set forth by the specified setup-time limit 110 and specified hold-time limit 120. The movement of the window of a time period to capture data may be caused by a number of factors, such as changes in temperature, operation, voltage-source levels, and the like. A centerline 130 provides a median position within the time frame encapsulated by the specified setup-time limit 110 and the specified hold-time limit 120 in which a window can be defined for capturing data/addresses. Ideally, it is desirable to center a window for capturing data/addresses about the centerline 130. The centerline 130 is generally exactly in the center between the specified setup-time limit 110 and the specified hold-time limit 120. However, movement of the window may cause errors in the timing, which may cause loss of data/addresses, or may cause the capturing of incorrect data and addresses.

A normal window at low temperature 140 is shown positioned asymmetrically about the centerline 130 within the encapsulated time frame. However, at high temperature the window in which data/addresses may be captured moves to the other side in an asymmetric fashion about the centerline 130, as indicated by a normal window at high temperature 150. Therefore, in order to ensure proper data/addresses access across a tolerable set of temperature range and/or voltage levels, an overall window 160 is defined.

The overall window 160 is generally calculated to encompass both a normal window at low temperature 140 and a normal window at high temperature 150. Therefore, the outer limits of the windows 140, 150 define a larger overall window 160 in order to ensure proper access/capture of data/addresses. This causes the overall window 160 to become large, thereby affecting the efficiency of the operation of electronic devices due to the large window needed for proper operation across temperature and/or voltage ranges. The use of the overall window 160 may lead to many inefficiencies and/or errors during the operation of memory access for data access devices.

The present invention is directed to overcoming, or at least reducing the effects of, one or more of the problems set forth above.

SUMMARY OF THE INVENTION

In one aspect of the instant invention, a method is provided for dynamically centering a setup-time and hold-time window. An access window defined by a setup-time and a hold-time is determined. A determination is made whether the access window is centered about a centerline. The centerline is a point between a predetermined setup-time limit and a predetermined hold-time limit. A dynamic access window centering process is performed in response to the determination that the access window is not centered about the centerline. The dynamic access window centering process includes: determining that the access window has shifted from the centerline; and providing at least one of a dynamic delay and a dynamic speed-up of the access window based upon the determination that the access window has shifted from the centerline.

In another aspect of the instant invention, an apparatus is provided for dynamically centering a setup-time and hold-time window. The apparatus of the present invention comprises a data storage device to provide stored data and a controller coupled to the data storage device. The controller is adapted to detect a movement of an access window defined by a predetermined setup-time limit and a predetermined hold-time limit and dynamically centers the access window between the setup-time and the hold-time limit in response to the movement of the access window.

In another aspect of the instant invention, a circuit is provided for dynamically centering a setup-time and hold-time window. The circuit of the present invention comprises a controller coupled to the memory. The controller is adapted to detect a movement of an access window defined by a predetermined setup-time limit and a predetermined hold-time limit and dynamically centers the access window between the setup-time and the hold-time limit in response to the movement of the access window.

In another aspect of the instant invention, a system board is provided for dynamically centering a setup-time and hold-time window. The system board of the present invention comprises a first device comprising a memory location for storing data and a dynamic access window unit. The dynamic access window unit is adapted to detect a movement of an access window defined by a predetermined setup-time limit and a predetermined hold-time limit and dynamically centers the access window between the setup-time and the hold-time limits in response to the movement of the access window. The system board also includes a second device operatively coupled to the first device. The second device is adapted to access data from the first device based upon the access window.

In yet another aspect of the instant invention, a memory device is provided for dynamically centering a setup-time and hold-time window. The memory device of the present invention comprises a controller adapted to detect a movement of an access window defined by a predetermined setup-time limit. The controller is also adapted to detect a predetermined hold-time limit and dynamically centers the access window between the setup-time and the hold-time limit in response to the movement of the access window.

BRIEF DESCRIPTION OF THE DRAWINGS

The invention may be understood by reference to the following description taken in conjunction with the accompanying drawings, in which like reference numerals identify like elements, and in which:

FIG. 7a illustrates a timing diagram relating to data/address latching in the context of a centered window, in accordance with one illustrative embodiment of the present invention;

FIG. 7b illustrates a timing diagram relating to data/address latching in the context of a setup-time violation, in accordance with one illustrative embodiment of the present invention;

FIG. 7c illustrates a timing diagram relating to data/address latching in the context of a hold-time violation, in accordance with one illustrative embodiment of the present invention;

Figure 1:
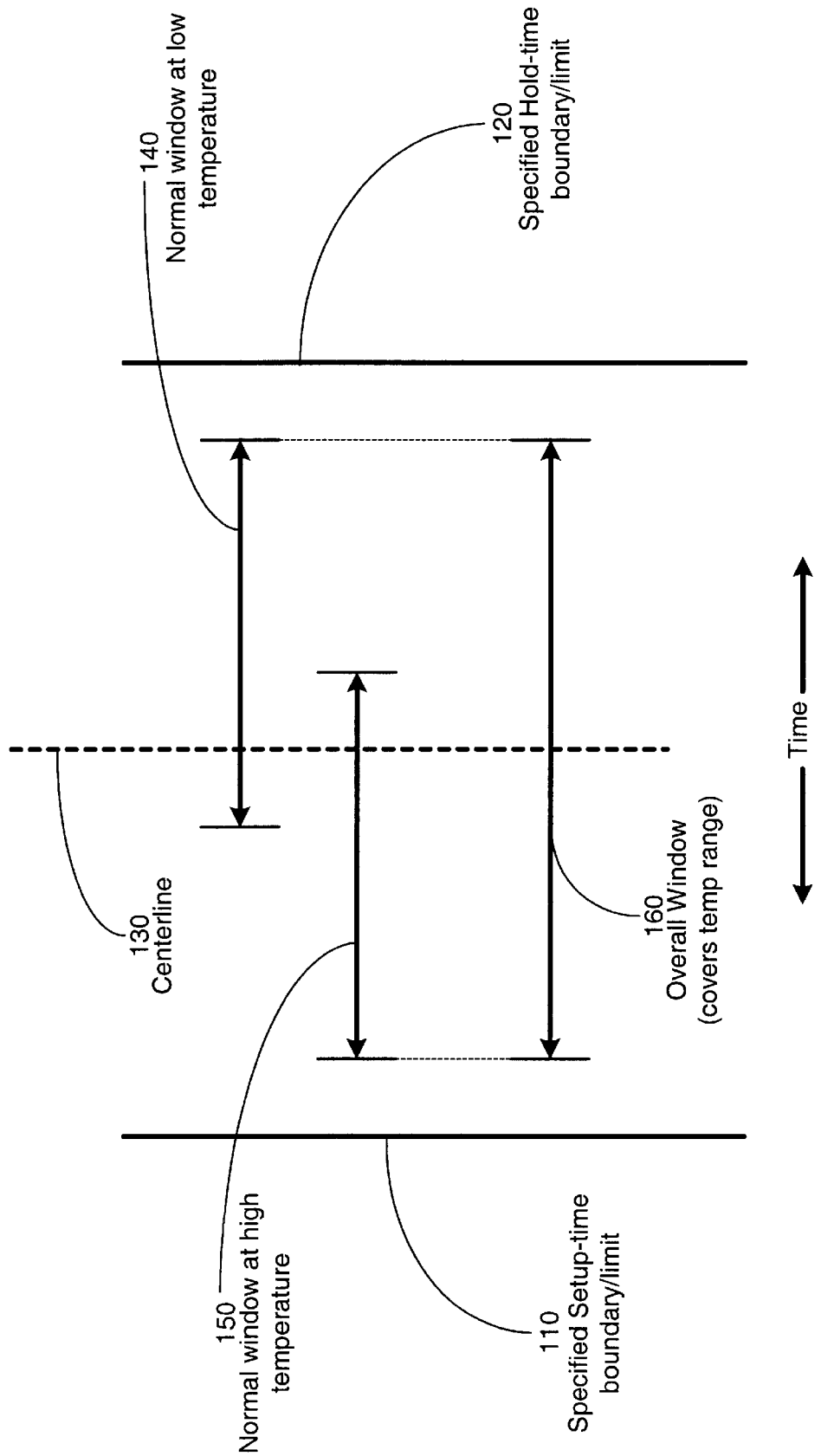
FIG. 1 is a diagram of a prior art time-period window encapsulated by a setup-time limit and a hold-time limit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The timing of circuit operations is important for the proper operation of digital systems. Access of data/addresses, such as latching address and/or data, within precise defined time periods is important in ensuring the integrity of the data and/or addresses that re captured by a device. Embodiments of the present invention provide for stabilizing a window that defines a time period for proper access of data/addresses. The window is generally encapsulated by a specified setup-time limit 110 and a specified hold-time limit 120. The setup and hold-time limits 110, 120 generally define the borders within which a window for accessing data/addresses is provided. Embodiments of the present invention provide for substantially placing the access window about a centerline 130 associated with the specified setup-time limit 110 and the specified hold-time limit 120. Embodiments of the present invention provide for dynamically adjusting the position of an access window to center or stabilize the window despite external factors, such as temperature, voltage-source levels, and the like. Embodiments of the present invention provide for reducing the drift of an access window based on one or more external influences upon the operation of the device.

Embodiments of the present invention provide for a smaller access window based upon dynamically adjusting the access window to overcome external factors, such as temperature, voltage-supply levels, and the like.

Figure 2:
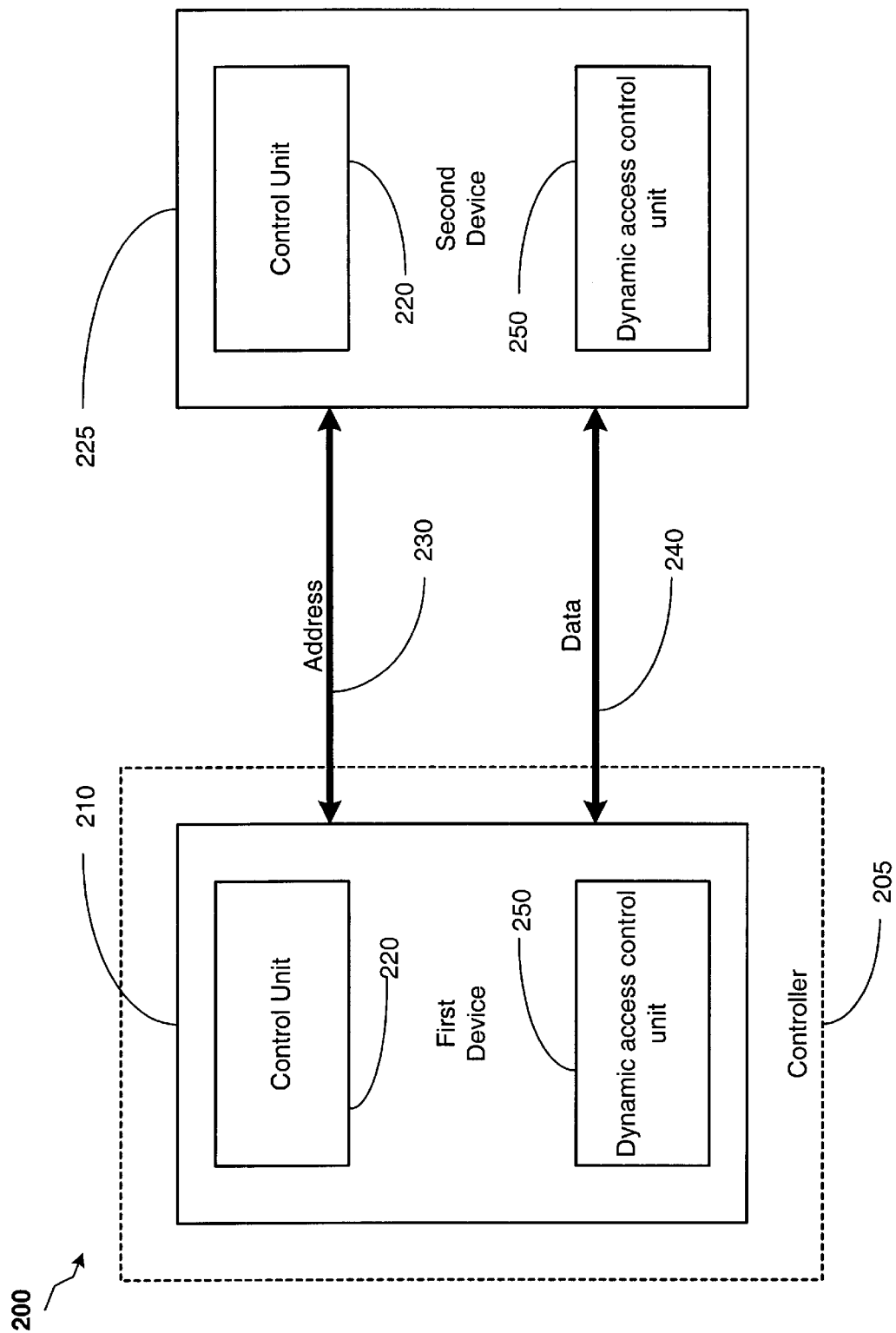
FIG. 2 is a block diagram representation of a system for performing a dynamic centering of a setup-time and a hold-time window, in accordance with one illustrative embodiment of the present invention.

Referring to FIG. 2, a block diagram of a system 200 is illustrated, in accordance with one embodiment of the present invention. The system 200 comprises a first device 210, which, in one embodiment, may be a memory unit capable of storing data. In one embodiment, the memory unit may be a dynamic random access memory (DRAM), a static random access memory (SRAM), a double-data rate DRAM (DDR DRAM), a Rambus™ DRAM (RDRAM), a FLASH memory unit, or the like. In one embodiment, the first device 210 may be encompassed by a controller 205. In one embodiment, the controller 205 may be a memory controller, a computer system, such as a PC-computer, and the like. In one embodiment, the controller 205 may be a system board, such as a motherboard for a computer system. The first device 210 may be accessed by a second device 225, which, in one embodiment, may be an accessing/access device. The second device 225 may send addresses on a line 230 to the first device 210. The first device 210 may then provide data to the second device 225 on a line 240. The first and second devices 210, 225 may comprise a control unit 220 capable of accessing data (including code) stored in the memory of the first device 210. The second device 225 may be any device that uses the first device 210 to store data, read data, or both. Examples of the second device 225 may include, but are not limited to, a computer, a camera, a telephone, a television, a radio, a calculator, a personal digital assistant, a network switch, and the like.

The control unit 220, in one embodiment, may manage the overall operations of the second device 225, including writing and reading data to and from the first device 210. The control unit 220 may comprise a microprocessor, a microcontroller, a digital signal processor, a processor card (including one or more microprocessors or controllers), a memory controller, or other control or computing devices.

In one embodiment, the memory in the first device 210 may be a memory device, such as a DRAM device, an SRAM device, a FLASH memory device, and the like. In one embodiment, the first device 210 may be a memory chip device that may be implemented into a digital system, such as a computer system. In an alternative embodiment, the first device 210 may be an external memory, such as a memory stick, and may be accessed when inserted into a slot (not shown) of the second device 225. When inserted into the slot, the second device 225 may provide the appropriate power and control signals to access memory locations in the first device 210. The first device 210 may be external to, or internal (e.g., integrated) to, the second device 225. The second device 225, such as a computer system, may employ a first device 210 (in the form of a memory unit) that is integrated within the computer system to store (e.g., BIOS [basic input/output system]) related to the computer system.

Figure 3:
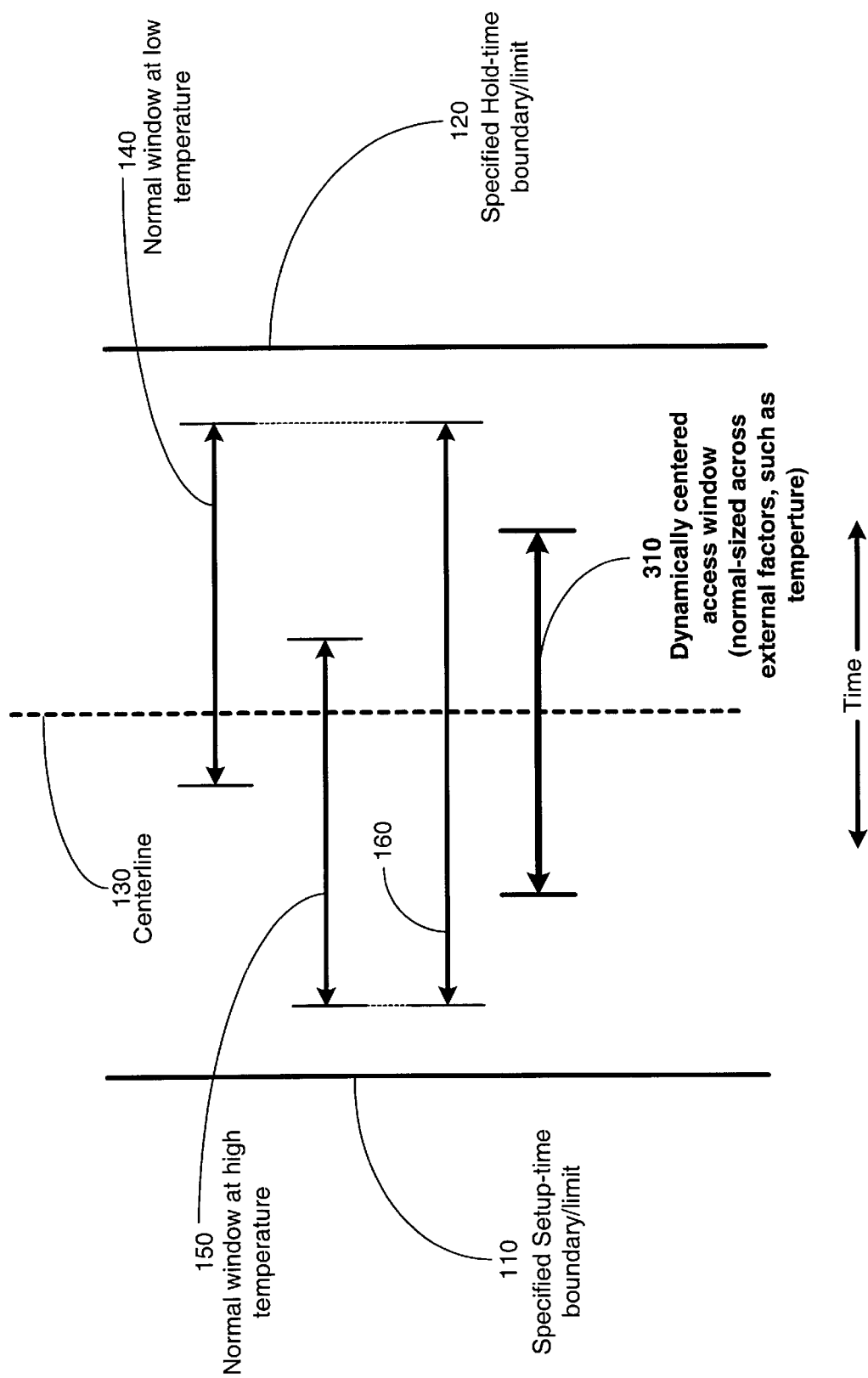
FIG. 3 illustrates a dynamically centered window encapsulated by a setup-time limit and a hold-time limit, in accordance with one illustrative embodiment of the present invention.

In one embodiment, the first and second devices 210, 225 may comprise a dynamic access control unit 250. The dynamic access control unit 250 is capable of providing an access window in which a time period is defined when data/addresses may be captured. The time period is generally defined by the setup-time limit 110 and the hold-time limit 120 available for a particular device. The dynamic access control unit 250 provides a delay and/or adjustment process for adjusting the position of a time period to define an access window for capturing data. The dynamic access control unit 250 provides for dynamically centering the access window, as shown in FIG. 3, about the centerline 130, producing a dynamically centered access window 310. As shown in FIG. 3, the dynamically centered access window 310 is substantially smaller than the prior art overall window (time period) 160 that is used to ensure proper operation over a range of temperatures and/or voltages. The dynamic access control unit 250 provides for dynamically centering the access window to compensate for drifting due to external factors. Therefore, the dynamically centered access window 310 can be a normal size window that is substantially immune from drifting within the time frame encapsulated by the specified setup-time limit 110 and the specified hold-time limit 120.

Figure 4:
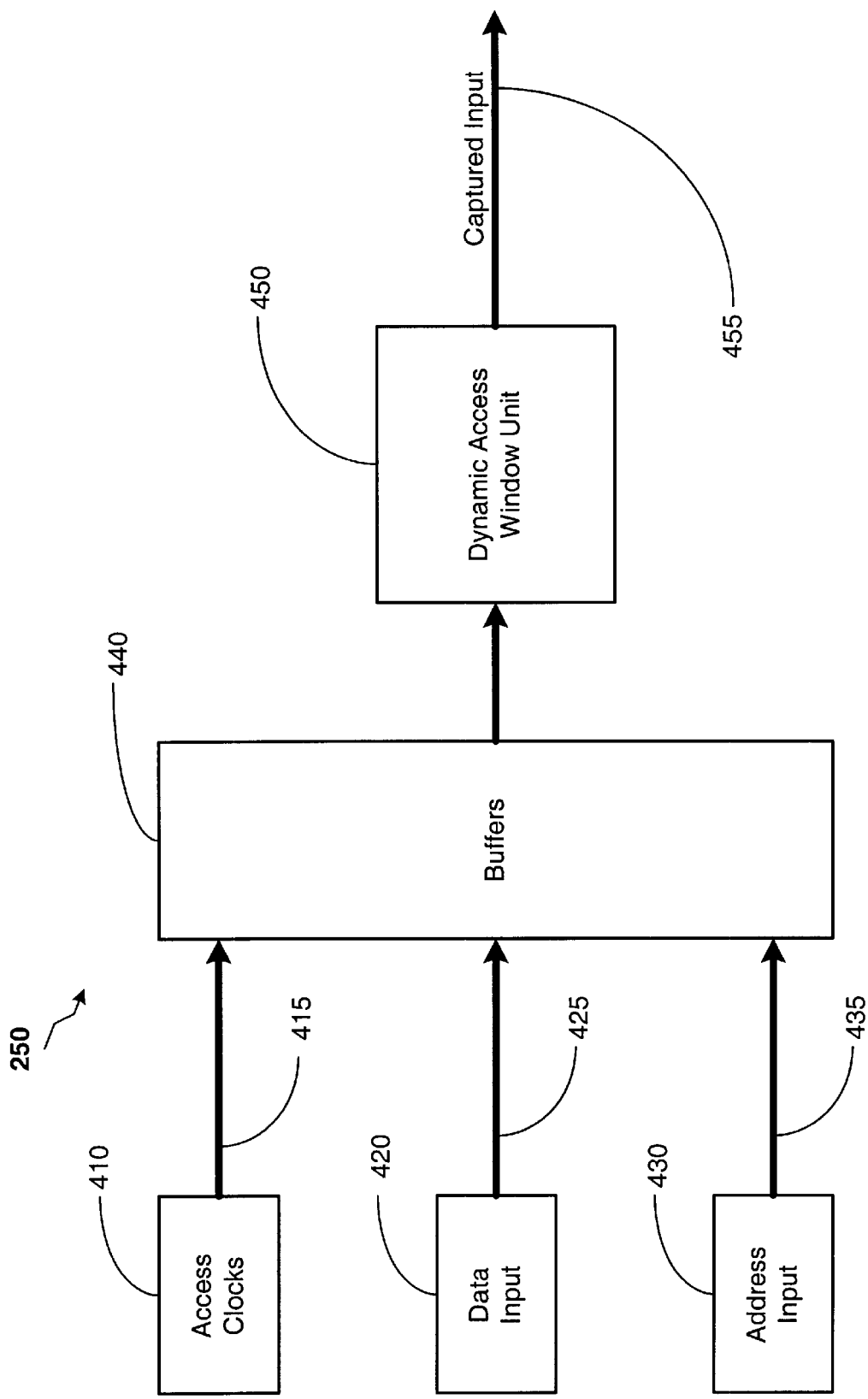
FIG. 4 illustrates a more detailed block diagram depiction of a dynamic access control unit of FIG. 2, in accordance with one illustrative embodiment of the present invention.

Turning now to FIG. 4, a block diagram representation of one embodiment of the dynamic access control unit 250 is illustrated. In one embodiment, the dynamic access control unit 250 comprises a plurality of buffers 440 for receiving a number of signals. Furthermore, the dynamic access control unit 250 comprises a dynamic access window unit 450 that provides a dynamically centered access window 310, which is centered about the centerline 130 to provide a captured input, which may comprise data and/or addresses on a line 455. The dynamic access window unit 450 is capable of performing a dynamic delay and/or a dynamic speed-up of the access window in response to a drift of the access window from the center of the time period bound by or defined by the specified setup-time boundary 110 and the specified hold-time boundary 120. Upon the capturing of the addresses/data, the first device 210 and/or the second device 225 has access to that data/address on the line 455.

The buffers 440 receive access clocks 410 on a line 415, a data input 420 on a line 425, and/or an address input 430 on a line 435. The access clocks 410 provide clock signals to latch/capture the data input 420 available on the line 425 and/or the address inputs 430 available on the line 435. The time period relating to the setup-time limit 110 and the hold-time limit 120 that define the dynamically centered access window 310, is centered by the dynamic access control unit 250. The dynamic centering is generally performed in response to external factors, such as temperature variations and/or voltage supply variations. Therefore, a smaller, normal sized access window may be employed, resulting in efficient operation of the first and second devices 210, 225. The dynamic access window unit 450 provides the centering of the access window such that the buffers 440 receiving the data input 420 and the address input 430 is captured within the specified timing of operation.

Figure 5:
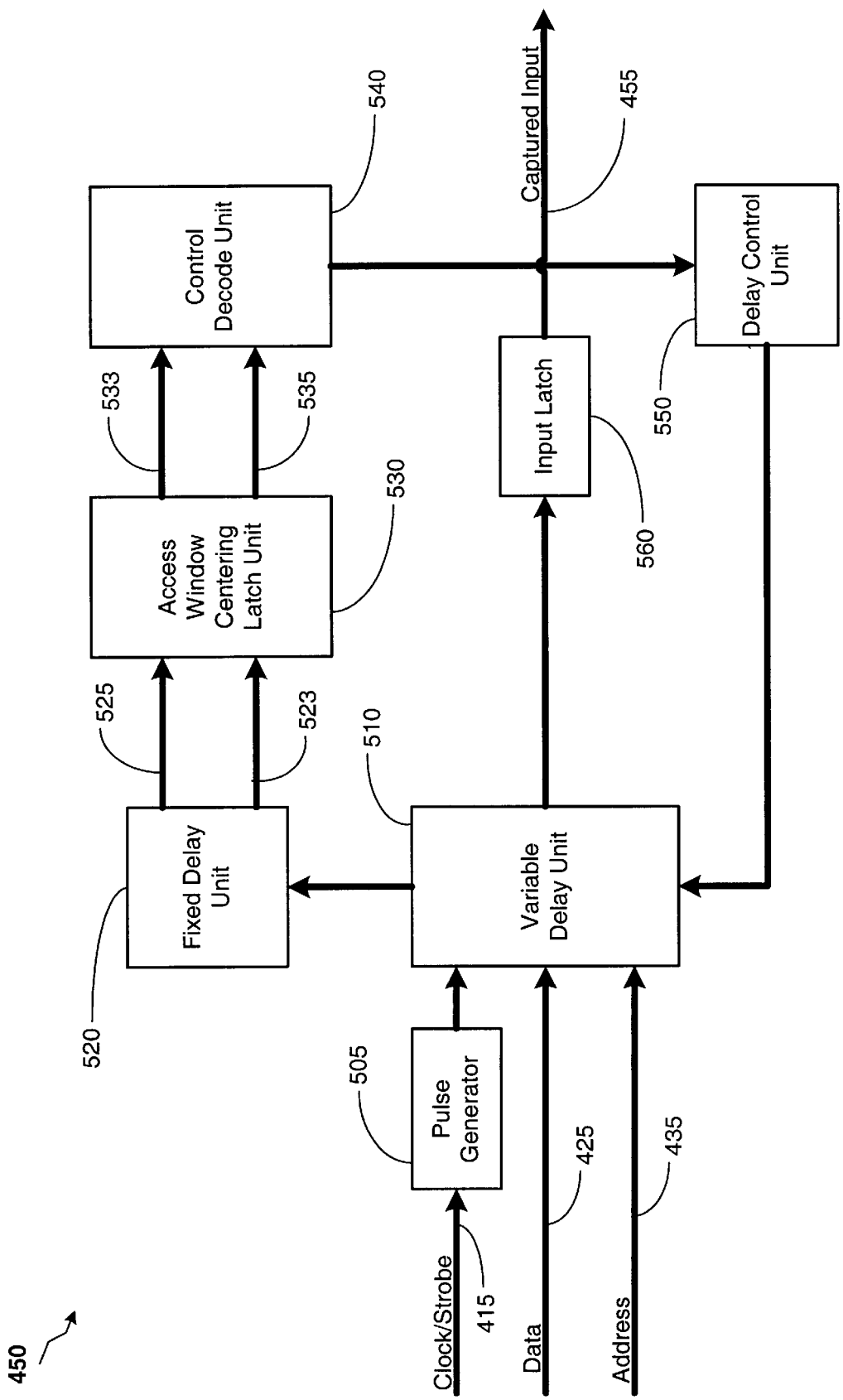
FIG. 5 illustrates a more detailed block diagram depiction of a dynamic access window unit of FIG. 4, in accordance with one illustrative embodiment of the present invention.

Turning now to FIG. 5, a more detailed block diagram illustration of the dynamic access window unit 450, in accordance with one embodiment of the present invention, is provided. FIG. 5 illustrates a feedback configuration, which comprises a delay control unit 550 and a variable delay unit 510 to substantially center the dynamically centered access window 310 about the centerline 130 for proper capture of address/data. A fixed delay unit 520 and the variable delay unit 510 are controlled by the delay control unit 550. The delay control unit 550 receives data from a control decode unit 540 to provide a feedback control of the movement of the dynamically centered access window 310 so that it can be dynamically centered within the limits defined by the specified setup-time limit 110 and the specified hold-time limit 120.

An access clock 410 on a line 415 is sent to a pulse generator 505. In one embodiment, the pulse generator 505 allows any setup and hold sensitive timing paths to be independent of the cycle time of an operating clock. The pulse-width generated by the pulse generator 505 may be used to define a "capture" range, or a time period for possible capture of addresses and/or data, the time period being encapsulated by the setup-time limit 110 and the hold-time limit 120. The clock signal is then sent to a fixed delay unit 520. The fixed delay unit 520 may provide a fixed delay to adjust the data/address capture range.

The fixed delay unit 520 may delay the pulse-width by dividing it by a factor (e.g., dividing by two) to create a setup-time sensitive path on a line 523. The fixed delay unit 520 may also delay the pulse-width signal to create a hold-time sensitive path on a line 525. The two paths, the setup sensitive path on the line 523 and the hold sensitive path on the line 525, are sent to an access window centering latch unit 530. The access window centering latch unit 530 latches the signals from the fixed delay unit 520 based upon an internal reference clock used to strobe incoming data.

The access window centering latch unit 530 essentially determines how well the access window 310 is centered between the capture ranges (i.e., how well the normal window is centered between the setup-time and hold-time limits 110, 120). The results from the access window centering latch unit 530 are sent to the control decode unit 540 on a line 533 and a line 535. The signals from the access window centering latch unit 530 are decoded by the control decode unit 540, which is capable of moving the variable delay such that it is used to dynamically shift the dynamically centered access window 310, which affects the operation of the input latch 560 that is used to capture the address or the data and provide it on the line 455.

The decoded data from the control decode unit 540 is received by the delay control unit 550. The delay control unit 550, in one embodiment, may be comprised of a counter and/or a register. The delay control unit 550 is capable of providing a variable delay using the variable delay unit 510 to provide a delaying function for the clock signal on the line 415, the address signal on the line 435, and/or for the data signal on the line 425. The delayed line that may carry the address of the data is then captured by the input latch 560, which is then provided as captured data or addresses on the line 455. The operation of the feedback delay control system illustrated in FIG. 5 dynamically centers the access window 310 about the centerline 130, which is the center point of the capture window encapsulated by the specified setup-time limit 110 and the specified hold-time limit 120.

Figure 6A:
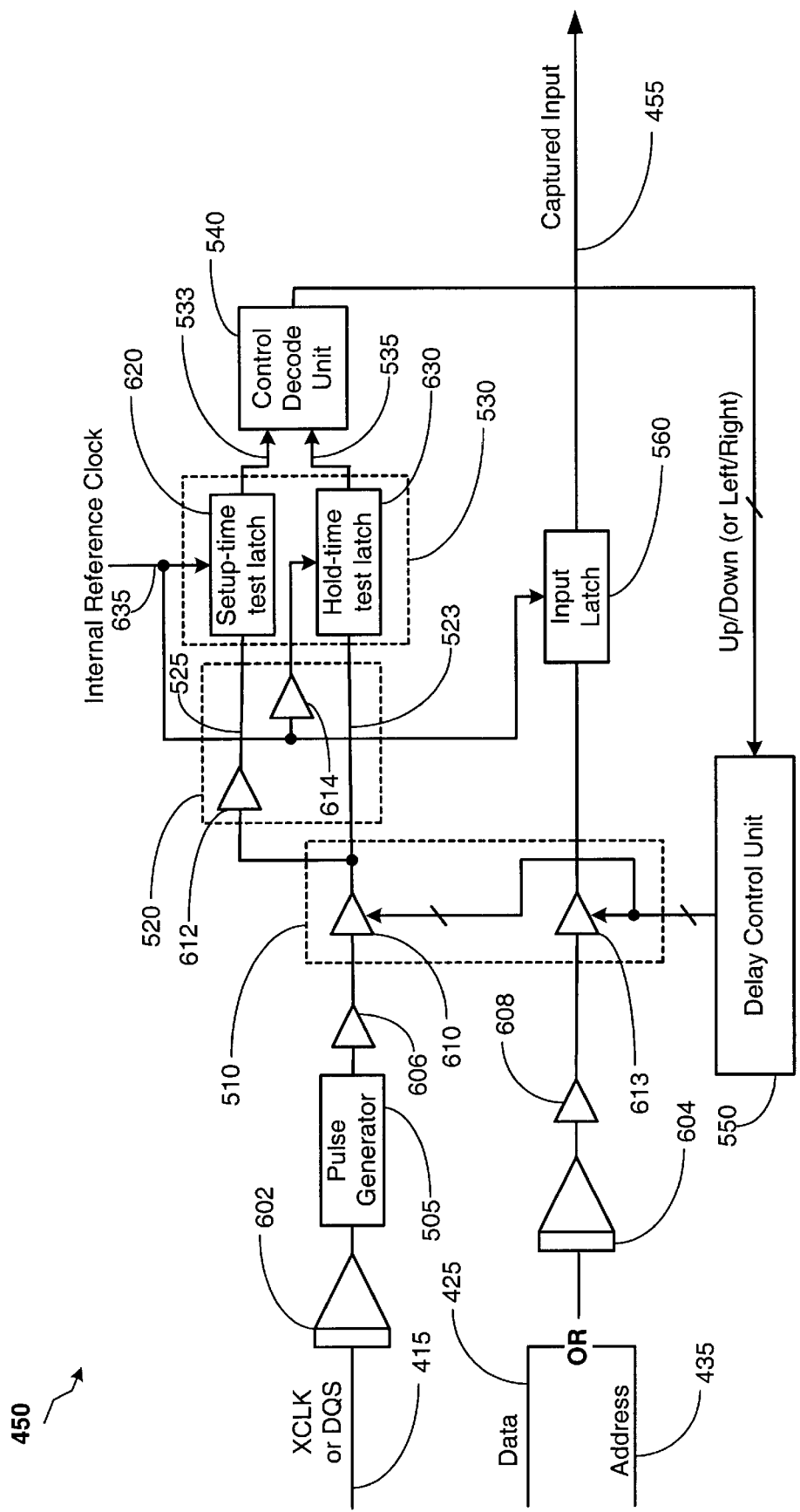
FIG. 6a illustrates a more detailed implementation of the dynamic access window unit of FIGS. 4 and 5, in accordance with one illustrative embodiment of the present invention.
Figure 6B:
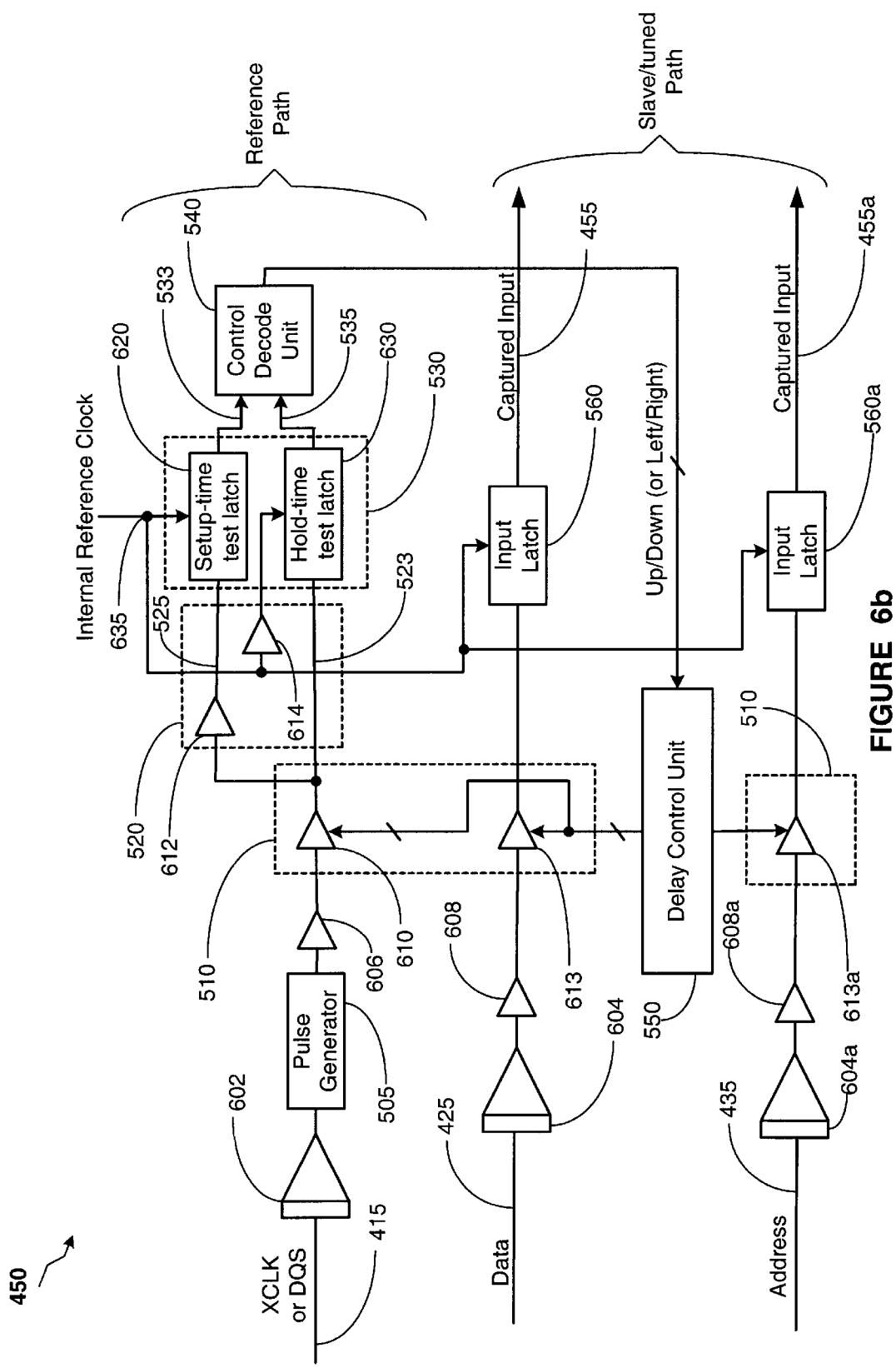
FIG. 6b illustrates a more detailed implementation of the dynamic access window unit of FIGS. 4 and 5, in accordance with an alternative illustrative embodiment of the present invention.
Figure 6C:
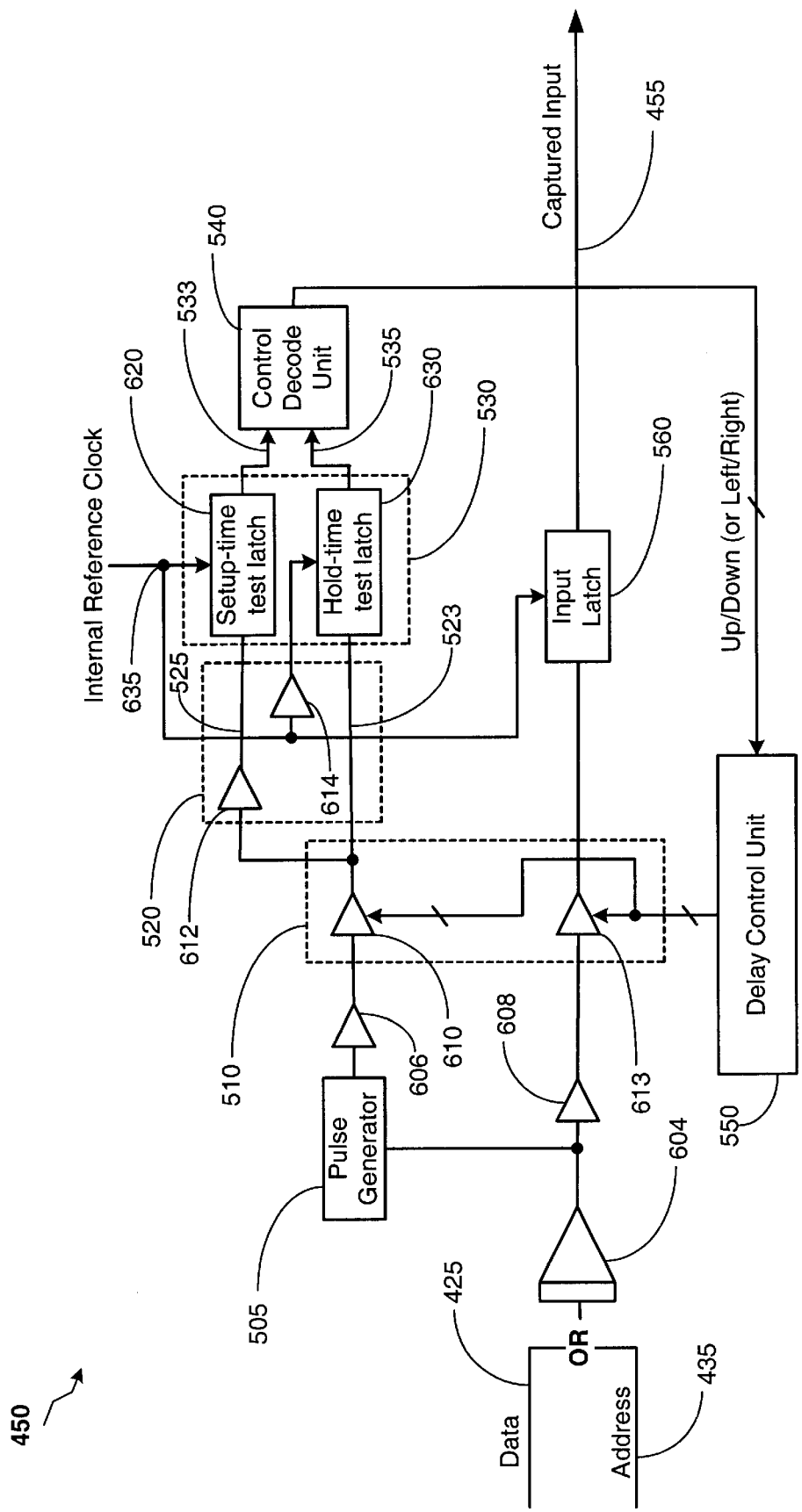
FIG. 6c illustrates a more test/initialization mode implementation of the dynamic access window unit of FIGS. 4 and 5, in accordance with an illustrative embodiment of the present invention.

Turning now to FIGS. 6a, 6b, and 6c, more detailed illustrations of implementations of the dynamic access window unit 450 are illustrated. Before functionally describing FIGS. 6a, 6b, and 6b, a description of the inter-connectivity of various components shown in FIGS. 6a and 6b is provided.

As shown in FIG. 6a, an input terminal of a matched input (unit) buffer 602 receives a clock or a data strobe signal on a line 415 (XCLK or DQS). The output terminal of the input buffer 602 is coupled with an input terminal of a pulse generator 505. An output terminal of the pulse generator 505 is coupled with an input terminal of a fixed-tuning delay buffer 606. An output terminal of the fixed-tuning delay buffer 606 is coupled with an input terminal of a variable delay buffer 610. An output terminal of the variable delay buffer 610 is provided to an input terminal of a fixed delay buffer 612 and to an input terminal of a hold-time test latch 630 via the line 523. An output terminal of the fixed delay buffer 612 is coupled with an input terminal of a setup-time test latch 620.

An input terminal of the hold-time test latch 630 also receives a delayed version of an internal reference clock on a line 635, which is provided to an input terminal of a fixed delay buffer 614, whose output terminal is coupled with a second input terminal of the hold-time test latch 630. The setup-time test latch 620 receives an internal reference clock on a line 635 onto a second input terminal. The output terminals from the setup-time test latch 620 and the hold-time test latch 630 are both sent to two input terminals of the control decode unit 540. An output terminal of the control decode unit 540, which may carry a plurality of digital signals, is then fed back to an input terminal of a delay control unit 550.

As described above, in one embodiment, the pulse generator 505 allows any setup and hold sensitive timing paths to be independent of the cycle time of an operating clock. By fixing the delay provided by the fixed delay buffer 612 to approximately one-half of the pulse width of a signal generated by the pulse generator 505, the setup-time sensitive path becomes independent of the operating clock. Similarly, by fixing the delay provided by the fixed delay buffer 614 to approximately one-half of the pulse width of a signal generated by the pulse generator 505, the hold-time timing path becomes independent of the operating clock.

Additionally, an input terminal of a matched input (unit) buffer 604 receives data on a line 425, or in an alternative embodiment, the matched input buffer 604 receives an address on a line 435 on its input terminal. As illustrated in FIG. 6b, in an alternative embodiment, the dynamic access window unit 450 may comprise a plurality of signal paths (e.g., one path for data and another path for address) that include a plurality of input buffers 604, 604a, fixed-tuning delay buffers 608, 608a, variable delay buffers 613, 613a, input latches 560, 560a, and captured input signals 455, 455a. Embodiments of the present invention are generally described as having a single signal path (e.g., data or address), however, it will be appreciated by those skilled in the art having the present disclosure, that a plurality of signal paths may be implemented using teachings of the present invention and remain within the spirit of the present invention.

An output terminal from the input buffer 604 is then coupled with an input terminal of the fixed-tuning delay buffer 608. An output terminal of the fixed-tuning delay buffer 608 is then coupled with an input terminal of the variable delay buffer 613. A feedback signal from the delay control unit 550 is coupled to an input terminal of the variable delay buffer 610 and the variable delay buffer 613. The feedback signal may comprise a plurality of digital signals. An output from the variable delay buffer 613 from an output terminal is coupled with an input terminal of the input latch 560. Another input terminal of the input latch 560 also receives an internal reference clock from the line 635. The output terminal from the input latch 560 then provides a captured input signal (data or address) on a line 455.

On the line 415 an address capture clock (XCLK) or a data capture strobe (DQS) is provided into the input buffer 602. The data on the line 425 and the address on the line 435 are also sent to the respective input buffer 604 (i.e., a plurality of instances of input buffers 604). In one embodiment, the input buffers 602 and 604 are matched input buffers. The clock signal on the line 415, after being buffered, is sent to the pulse generator 505 to allow for establishing the setup and hold sensitive paths in the circuit of FIG. 6a to be independent of cycle time. In one embodiment, the fixed-tuning delay buffers 606, 608 are implemented upon the clock signal, the data signal, or upon the address signal for fixed tuning adjustments in their respective timing. The adjusted signals are then sent to the variable delay unit 510.

The variable delay unit 510 comprises the variable delay buffers 610, 613. The variable delays provided by the variable delay unit 510 are dynamically tuned to the center of the setup-time and hold-time windows. In one embodiment, the variable delay unit 510 may also comprise additional variable buffers, such as the variable delay buffer 613a, used for the address path shown in FIG. 6b. Turning back to FIG. 6b, in one embodiment, the total delay variation may be approximately 800 picoseconds. The output from the variable delay buffer 610 provides a setup-time sensitive path and a hold-time sensitive path. The setup-time sensitive path via the line 525 is delayed by a fixed delay buffer 612 in the fixed delay unit 520. The hold-time sensitive path on the line 535 is sent without delay to the access window centering latch unit 530.

The access window centering latch unit 530 comprises the setup-time test latch 620 and the hold-time test latch 630. An internal reference clock on a line 635 is used to strobe incoming data address and strobe the latches 620, 630. The reference clock on the line 635 latches the setup-time sensitive path on the line 525 into the setup-time test latch 620. A delayed version of the reference clock on the line 635, which is delayed by the fixed delay buffer 614, is used to latch the hold-time sensitive path into the hold-time test latch 630. The output from the latches 620 and 630 are then sent to the control decode unit 540. In one embodiment, the setup/hold measurement circuitry provided by the access window centering latch unit 530 may be instantiated for every input, or combinations of reference paths and slave paths may be made. In one embodiment, the reference path comprises the setup-time sensitive path and the hold-time sensitive path. The slave/tuned path comprises the variable time delay buffers 613, 613a and respective input latches 560, 560a, which provides the respective captured inputs 455, 455a (as shown in FIG. 6b). For example, the line 455 may contain a tuned data path, and the line 455a may contain a tuned address path.

Turning back to FIG. 6a, if an external factor such as temperature and/or voltage fluctuations is experienced by the first or second devices 210, 225, the resulting delays to the access window may be adjusted to compensate for the variations. If the setup-time test latch 620 detects that the rising edge of a capture signal is missed due to a setup-time violation, then the setup-time test latch 620 will register a logic "one" into the control decode unit 540. Therefore, the control decode unit 540 will receive a logical one and a logical zero, respectively, from the latches 620, 630. The control decode unit 540 will then decode the inputs to interpret that the delays are more sensitive to the setup-time, so the data needs to be sent to the input latch 560 sooner for proper capture of the data or address onto the line 455. Therefore, the control decode unit 540 will send a signal to the delay control unit 550 that changes the delay on the variable delay unit 510, specifically, into the variable delay buffers 610, 613. Therefore, a feedback loop is created to substantially center the access window dynamically about the centerline 130 to overcome drifts caused by external factors. A test/initialization implementation of the circuit described in FIGS. 6a and 6b is provided in FIG. 6c. A more detailed description of the test/initialization implementation is provided below after a description of timing diagrams related to the circuits of FIGS. 6a, 6b, and 6c.

Examples of timing diagrams relating to the operation of the latches 620, 630 are illustrated in FIG. 7. The timing of the latch 620, which is the setup-time test latch, and latch 630, which is the hold-time sensitive latch, are shown in the example illustrated in FIG. 7a. In this scenario, a strobe of a strobe clock 710 occurs between the rising edge of the setup-time test latch 620 and the falling edge of the hold-time test latch 630, thereby indicating that the access window is centered about the centerline 130. Therefore, no change to the variable delay unit 510 is required in this situation (i.e., the access window is approximately centered about the centerline 130).

FIG. 7b illustrates the timing of the setup-time test latch 620 and the hold-time test latch 630 in which a setup-time violation occurs. The strobe of the strobe clock 710 occurs before the rising edge of the setup-time test latch 620 and before the falling edge of the hold-time test latch 630, thereby resulting in a setup-time violation. In other words, the strobe clock 710 does not occur in the dynamically centered access window 310. Therefore, a setup-time violation is detected and the delay control unit 550 may make a setup-time correction by removing a delay.

In FIG. 7c, a timing diagram is shown where the strobe clock 710 occurs after the falling edge of the hold-time sensitive signal, ie., outside the access window 310 at the edge of the specified hold-time limit 120. Therefore, a hold violation is detected and a delay is added using the delay control unit 550 in order to reconfigure the access window such that it is substantially centered about the centerline 130.

In order to make a half-cycle window sensitive to setup-time and then the same half-cycle window sensitive to hold-time, an offset of the waveforms has to occur. The example shown in FIG. 7a illustrates that the setup-time test latch 620 input signal, where it is setup-time sensitive, with the rising edge very near the strobe clock 710. Therefore, as temperature starts to change, the strobe clock 710 may occur a little late, thereby causing a setup-time violation. Therefore, a logical one may have been strobed during normal operation, but when a setup-time violation occurs, the setup-time latch 620 will provide a logical zero to the control decode unit 540. Therefore, an indication is provided to the control decode unit 540 that a setup-time error has occurred, indicating that the access window may not be centered about the centerline 130.

Likewise, on the hold-time sensitive path on the line 535, the hold-time test latch 630 may have barely enough time to properly latch a logical one. Therefore, when the external factor, such as temperature and/or voltage speeds the timing even more, a hold-time violation may occur, prompting the hold-time test latch 630 to register a logical zero instead of a logical one. This indicates to the control decode unit 540 that a hold-time error may have occurred, implying that the access window is not centered about the centerline 130.

The reference path that clocks the test latches 620, 630 is also used to clock the input latch 560. Therefore, all latches have the same reference path, therefore, tuning of the timing indicated by the dynamic access window unit 450 will terminate once proper tuning is achieved. In addition to the description provided above, an initialization sequence for setting up the setup-time and hold-time paths 525 and 535 may be implemented. For example, a test mode or an initialization mode may be implemented with a control bit that would be sent to the control decode unit 540 to indicate that the dynamic access window unit 450 is in a test/initialization mode. During this period of time, a clock may be toggling high and low on every cycle going into an address. This sequence would, in one embodiment, require 10 to 50 cycles. At that point, the dynamic access window unit 450 will then turn off the input to the control decode unit 540 indicating shutdown. With the control decode unit 540 inactive, the settings in the delay control unit 550 would be static instead of being variable. The address or the data will then be clocked in a normal fashion without the feedback adjustments to provide data or addresses on the captured input line 455.

Additionally, in a test/initialization implementation, the input buffer 602 may be eliminated (see FIG. 6c). In one embodiment, during the initialization mode, the function of the input buffer 602 of FIGS. 6a and 6b is generally performed by the input buffer 604. In other words, the dynamic centering function described above is only used during an initialization or a test mode. This provides the advantage of not having the clock input buffer 602 substantially perfectly match address/data buffer 604. Therefore, two input buffers 602, 604 do not have to be matched substantially perfectly, since their respective functions are performed by one input buffer, as shown in FIG. 6c. Furthermore, additional circuit layout space may be conserved by using only one input buffer 604. In the embodiment of FIG. 6c, only the forward path for the address or data (i.e., the input buffer 604, the variable delay buffer 613, and the input latch 560) toggles after initialization. In one embodiment, variable tuning provided in the forward path of FIG. 6c is dynamic only in initialization.

Figure 8:
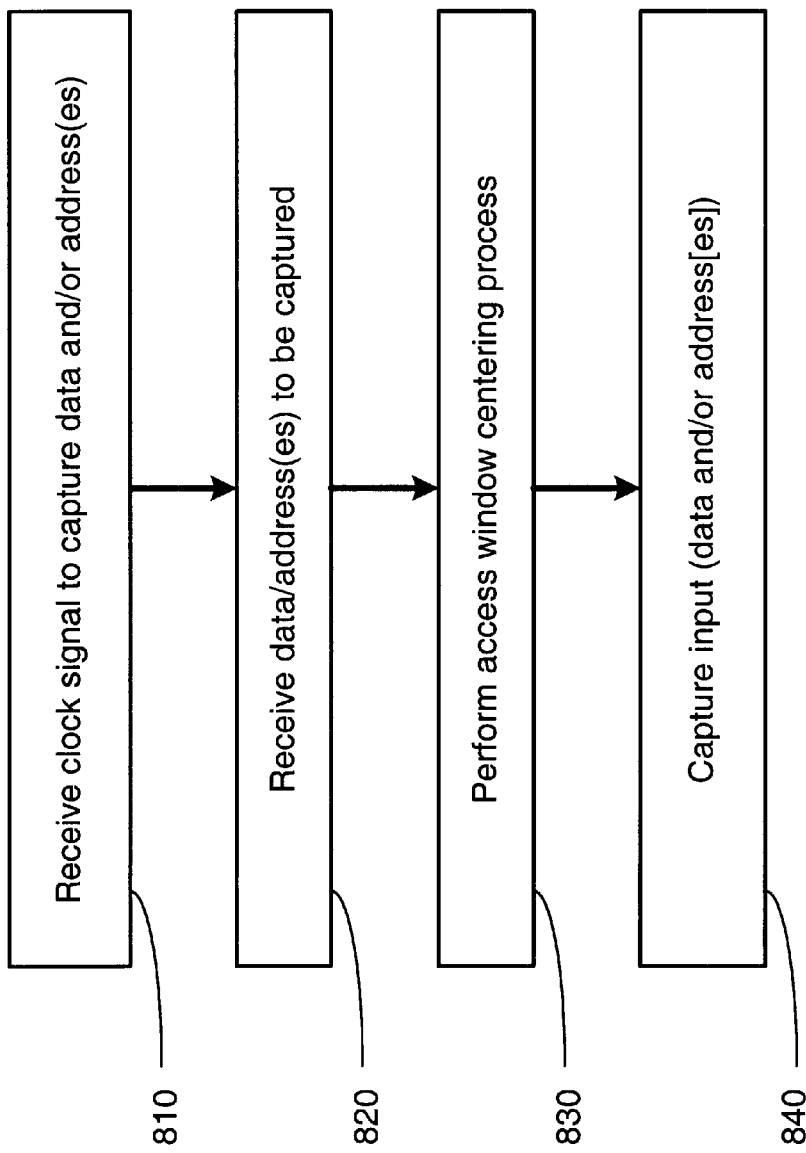
FIG. 8 illustrates a flowchart representation of a method of performing dynamic centering of a setup-time/hold-time window, in accordance with one illustrative embodiment of the present invention.

Turning now to FIG. 8, a flow chart depiction of one embodiment of a method of performing dynamic centering of a setup-time/hold-time window, in accordance with the present invention is illustrated. The system 200 receives a clock and/or a strobe signal to capture data or addresses (block 810). The system 200 also receives the addresses or data to be captured for transmission (block 820). Subsequently, the system 200 performs an access window centering process to insure that the access window is approximately centered about the centerline 130 (block 830). The centerline 130 is the center of a time period encapsulated by the specified hold-time limit 120 and the specified setup-time limit 110. A more detailed description of performing the access window centering process is described in FIG. 9 and accompanying description below. Subsequently, the system 200 captures (block 840) the input, ie., capturing the data or addresses and places it on a capture input line 455 for use by a device calling for the addresses and/or data.

Figure 9:
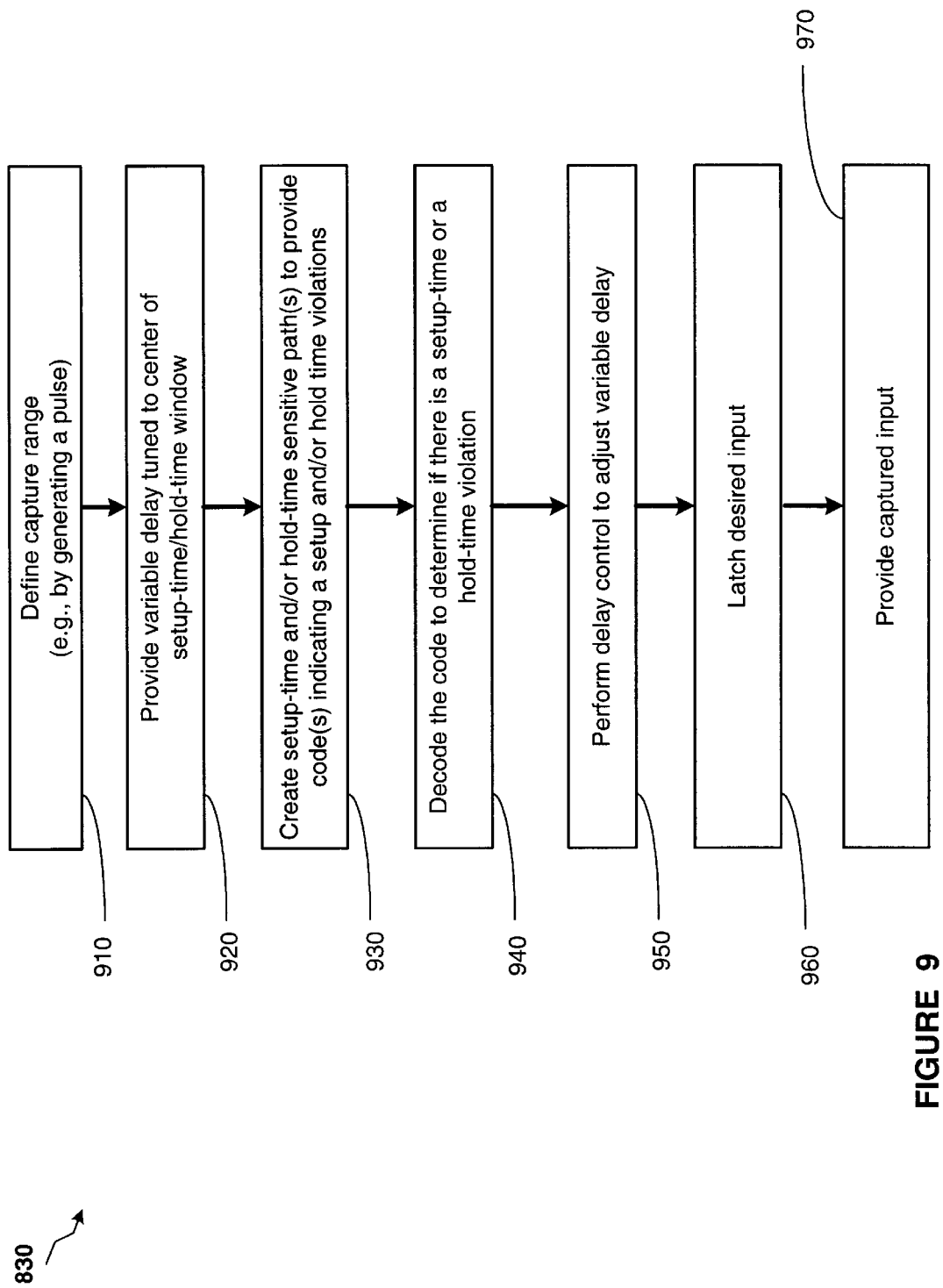
FIG. 9 illustrates a more detailed flowchart representation of steps for performing an access window centering process, as indicated in FIG. 8, in accordance with one illustrative embodiment of the present invention.

Turning now to FIG. 9, a flow chart depiction of a more detailed description of the access window centering process is illustrated. The system 200 defines a capture range by generating a pulse in which the capture of the addresses and/or data may take place (block 910). The system 200 then provides a variable delay tuned to the center of the setup-time and hold-time window within the capture range (block 920). The system 200 creates a setup-time sensitive path on a line 525 and a hold-time sensitive path on a line 535. By creating the paths 525, 535, the system 200 provides a control code indicating setup-time or hold-time failure, which is then used for correction of setup/hold-time limit 110, 120 violations (block 930).

The system 200 then decodes the control code to interpret which type of failure, ie., setup-time failure or hold-time time failure (block 940). The system 200 then provides a delay control to adjust a variable delay unit 510 to compensate for the setup/hold-time errors, and to dynamically center the access window about the centerline 130 (block 950). The system 200 then latches the address or data using an input latch 560 (block 960). The system 200 then provides (block 970) the capture input (data or addresses) on a captured input line 455 for use by the system 200. The embodiments described above may be utilized for latching, clocking, accessing, data or addresses for a variety of devices, such as memory devices, processors, registers and the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining an access window defined by a setup-time and a hold-time;
   determining that said access window is not centered about a centerline, said centerline being a point between a predetermined setup-time limit and a predetermined hold-time limit;
   performing a dynamic access window centering process in response to said determination that said access window is not centered about said centerline, said dynamic access window centering process comprising:
      determining that said access window has shifted from said centerline, and
      providing at least one of a dynamic delay and a dynamic speed-up of said access window based upon said determination that said access window has shifted from said centerline.

2. The method described in claim 1, further comprising performing a data access based upon said dynamic access window centering processing.

3. The method described in claim 1, wherein determining that said access window is not centered about a centerline further comprises determining that there is a setup-time violation.

4. The method described in claim 1, wherein determining that said access window is not centered about a centerline further comprises determining that there is a hold-time violation.

5. The method described in claim 1, wherein performing a dynamic access window centering process further comprises centering said access window about said centerline in response to a movement of said access window, said movement resulting from a temperature change.

6. The method described in claim 1, wherein performing a dynamic access window centering process further comprises centering said access window about said centerline in response to a movement of said access window, said movement resulting from a voltage-level change.

7. The method described in claim 1, wherein performing a dynamic access window centering process further comprises:
   defining a data capture range for said access window;
   providing a variable delay tuned to the center of said access window;
   creating a setup-time sensitive path to provide a first code to indicate a setup-time failure;
   creating a hold-time sensitive path to provide a second code to indicate a hold-time failure;
   performing a delay control to provide said variable delay to adjust a first variable delay of said setup-time sensitive path in response to decoding said first code to reduce a setup-time failure; and
   performing a delay control to provide said variable delay to adjust a second variable delay of said hold-time sensitive path in response to decoding said second code to reduce a hold-time failure; and
   centering said access window based upon said first variable delay of said setup-time sensitive path and said second variable delay of said hold-time sensitive path.

8. The method described in claim 7, further comprising providing a setup-time sensitive path that is independent of an operating clock.

9. The method described in claim 8, wherein providing said setup-time sensitive path that is independent of an operating clock further comprises providing a delay buffer that provides a delay of approximately one-half of a signal generated by a pulse generator.

10. The method described in claim 7, further comprising providing a hold-time sensitive path that is independent of an operating clock.

11. The method described in claim 10, wherein providing said hold-time sensitive path that is independent of an operating clock further comprises providing a delay buffer that provides a delay of approximately one-half of a signal generated by a pulse generator.

12. The method described in claim 7, further comprising latching data based upon said centering said access window.

13. The method described in claim 7, wherein defining a data capture range for said access window further comprises providing a pulse upon a clock signal using a pulse generator.

14. A method, comprising:
   determining a data capture range for defining an access window bound by a predetermined setup-time limit and a predetermined hold-time limit.
   determining whether at least one of a setup-time error and a hold-time error occurred based upon said access window;
   determining that said access window is not centered about a centerline that is a center point between said predetermined setup-time limit and a predetermined hold-time limit based upon at least one of said setup-time error and said hold-time error; and
   performing a dynamic access window centering process in response to said determination that said access window is not centered about said centerline, said dynamic access window centering process comprising providing at least one of a dynamic delay and a dynamic speed-up of said access window based upon said determination that said access window has shifted from said centerline.

15. The method described in claim 14, further comprising performing a data access based upon said dynamic access window centering process.

16. The method described in claim 14, wherein performing a dynamic access window centering process further comprises:
   providing a variable delay tuned to the center of said access window;
   creating a setup-time sensitive path to provide a first code to indicate a setup-time failure;
   creating a hold-time sensitive path to provide a second code to indicate a hold-time failure;
   performing a delay control to provide said variable delay to adjust a first variable delay of said setup-time sensitive path in response to decoding said first code to reduce a setup-time failure; and
   performing a delay control to provide said variable delay to adjust a second variable delay of said hold-time sensitive path in response to decoding said second code to reduce a hold-time failure; and
   centering said access window based upon said first variable delay of said setup-time sensitive path and said second variable delay of said hold-time sensitive path.

17. An apparatus, comprising:
   a data storage device to provide stored data; and
   a controller coupled to said data storage device, said controller being adapted to detect a movement of an access window defined by a predetermined setup-time limit and a predetermined hold-time limit and dynamically centers said access window between said setup-time and said hold-time limit in response to said movement of said access window.

18. The apparatus described in claim 17, wherein said data storage device is at least one of a static random access memory (SRAM), a dynamic random access memory (DRAM), a double-data rate DRAM (DDR DRAM), a Rambus DRAM (RDRAM), and a FLASH memory.

19. The apparatus described in claim 17, wherein said access window defines a time period for latching said data in said data storage device.

20. The apparatus described in claim 17, wherein said controller comprises a dynamic access window unit for dynamically centering said access window, said dynamic access window unit comprising:
   a first matched input unit to receive at least one of a data input signal and an address input signal;
   a pulse generator coupled to a clock input signal, said pulse generator adapted to provide a pulse for allowing the formation of a setup-time sensitive path and a hold-time sensitive path independent of a cycle time defined by said clock input signal;
   a variable delay unit operatively coupled to an output of said pulse generator and to a data input signal, said variable delay unit to provide a variable delayed clock output to generate said setup-time sensitive path and said hold-time sensitive path and to provide a delayed data output for latching said data output;

a fixed delay unit operatively coupled to said variable delay unit, to generate at least one of said setup-time sensitive path and said hold-time sensitive path;

an access window centering latch unit operatively coupled to said fixed delay unit, said access window centering latch unit adapted to provide a first code responsive to a setup-time violation and a second code responsive to a hold-time violation;

a control decode unit operatively coupled to said access window centering latch unit, said control decode unit adapted to decode said first code and said second code to provide a delay control data;

a delay control unit operatively coupled to said control decode unit, said delay control unit adapted to receive said delay control data and provide a variable delay signal to said variable delay unit to control said variable delay imposed upon said clock input signal and to at least one of said data input signal and said address input signal; and an input latch operatively coupled to said variable delay unit, said input latch to provide latching of at least one of said delayed data input signal and said address input signal to provide a captured input signal.

21. The apparatus described in claim 20, wherein said fixed delay unit to provide a delay that is approximately one-half of a pulse width of said pulse generated by said pulse generator, to allow said setup-time sensitive path to be independent of said cycle time.

22. The apparatus described in claim 20, further comprising a second fixed delay unit to provide a delay that is approximately one-half of a pulse width of said pulse generated by said pulse generator, to allow said hold-time sensitive path to be independent of said cycle time.

23. The apparatus described in claim 20, wherein said dynamic access window unit further comprising a second matched input unit operatively coupled to said variable delay unit, said second matched input unit being substantially matched with said first matched input unit and to receive at least one of a clock signal and a strobe signal provide a fixed-delay.

24. The apparatus described in claim 23, wherein a first tuned path for said data input signal is defined by said first matched input unit, a first fixed-tuning delay buffer operatively coupled to said first matched input unit, said variable delay unit, and said input latch.

25. The apparatus described in claim 23, wherein a second tuned path for said address input signal is defined by a third matched input unit, a second fixed-tuning delay buffer operatively coupled to said third matched input unit, a second variable delay unit operatively coupled to said third matched input unit, and a second input latch operatively coupled to said second variable delay unit.

26. The apparatus described in claim 20, wherein said delay control unit comprises a register for generating said variable delay data.

27. The apparatus described in claim 20, wherein said delay control unit comprises a counter for generating said variable delay data.

28. A circuit for accessing memory, comprising:

a controller coupled to said memory, said controller being adapted to detect a movement of an access window defined by a predeter mined setup-time limit and a predetermined hold-time limit and to dynamically center said access window between said setup-time limit and said hold-time limit in response to said movement of said access window.

29. The circuit described in claim 28, wherein said access window defines a time period for latching said data in said data storage device.

30. The circuit described in claim 29, wherein said controller comprises a dynamic access window unit for dynamically centering said access window, said dynamic access window unit comprising:

a first matched input unit to receive at least one of a data input signal and an address input signal;

a pulse generator coupled to a clock input signal, said pulse generator adapted to provide a pulse for allowing the formation of a setup-time sensitive path and a hold-time sensitive path independent of a cycle time defined by said clock input signal;

a variable delay unit operatively coupled to an output of said pulse generator and to a data input signal, said variable delay unit to provide a variable delayed clock output to generate said setup-time sensitive path and said hold-time sensitive path and to provide a delayed data output for latching said data output;

a fixed delay unit operatively coupled to said variable delay unit, to generate at least one of said setup-time sensitive path and said hold-time sensitive path;

an access window centering latch unit operatively coupled to said fixed delay unit, said access window centering latch unit adapted to provide a first code responsive to a setup-time violation and a second code responsive to a hold-time violation;

a control decode unit operatively coupled to said access window centering latch unit, said control decode unit adapted to decode said first code and said second code to provide a delay control data;

a delay control unit operatively coupled to said control decode unit, said delay control unit adapted to receive said delay control data and provide a variable delay signal to said variable delay unit to control said variable delay imposed upon said clock input signal and to at least one of said data input signal and said address input signal; and an input latch operatively coupled to said variable delay unit, said input latch to provide latching of at least one of said delayed data input signal and said address input signal to provide a captured input signal.

31. The circuit described in claim 30, wherein said fixed delay unit to provide a delay that is approximately one-half of a pulse width of said pulse generated by said pulse generator, to allow said setup-time sensitive path to be independent of said cycle time.

32. The circuit described in claim 30, further comprising a second fixed delay unit to provide a delay that is approximately one-half of a pulse width of said pulse generated by said pulse generator, to allow said hold-time sensitive path to be independent of said cycle time.

33. The circuit described in claim 30, wherein said dynamic access window unit further comprising a second matched input unit operatively coupled to said variable delay unit, said second matched input unit being substantially matched with said first matched input unit and to receive at least one of a clock signal and a strobe signal provide a fixed-delay.

34. The circuit described in claim 33, wherein a first tuned path for said data input signal is defined by said first matched input unit, a first fixed-tuning delay buffer operatively coupled to said first matched input unit, said variable delay unit, and said input latch.

35. The circuit described in claim 33, wherein a second tuned path for said address input signal is defined by a third matched input unit, a second fixed-tuning delay buffer operatively coupled to said third matched input unit, a second variable delay unit operatively coupled to said third matched input unit, and a second input latch operatively coupled to second variable delay unit.

36. A system board, comprising:
- a first device comprising a memory location for storing data and a dynamic access window unit, said dynamic access window unit being adapted to detect a movement of an access window defined by a predetermined setup-time limit and a predetermined hold-time limit and to dynamically center said access window between said setup-time and said hold-time limits in response to said movement of said access window; and
- a second device operatively coupled to said first device, said second device to access data from said first device based upon said access window.

37. The system board described in claim 36, wherein said memory location is at least one of an SRAM, a DRAM, a DDR DRAM, a RDRAM, and a FLASH memory.

38. The system board of claim 36, wherein said system board is a motherboard of a computer system.

39. The system board described in claim 36, wherein said controller comprises a dynamic access window unit for dynamically centering said access window, said dynamic access window unit further comprises:
- a pulse generator coupled to a clock input signal, said pulse generator adapted to provide a pulse for allowing the formation of a setup-time sensitive path and a hold-time sensitive path independent of a cycle time defined by said clock input signal;
- a variable delay unit operatively coupled to an output of said pulse generator and to a data input signal, said variable delay unit to provide a variable delayed clock output to generate said setup-time sensitive path and said hold-time sensitive path and to provide a delayed data output for latching said data output;
- a fixed delay unit operatively coupled to said variable delay unit, to generate at least one of said setup-time sensitive path and said hold-time sensitive path;
- an access window centering latch unit operatively coupled to said fixed delay unit, said access window centering latch unit adapted to provide a first code responsive to a setup-time violation and a second code responsive to a hold-time violation;
- a control decode unit operatively coupled to said access window centering latch unit, said control decode unit adapted to decode said first code and said second code to provide a delay control data;
- a delay control unit operatively coupled to said control decode unit, said delay control unit adapted to receive said delay control data and provide a variable delay signal to said variable delay unit to control said variable delay imposed upon said clock input signal and said data input signal; and
- an input latch operatively coupled to said variable delay unit, said input latch to provide latching of said delayed data output to provide a captured input signal.

40. The system board described in claim 39, wherein said delay control unit comprises a register for generating said variable delay data.

41. The system board described in claim 39, wherein said delay control unit comprises a counter for generating said variable delay data.

42. A computer system, comprising:
- a first device comprising a memory location for storing data and a dynamic access window unit, said dynamic access window unit being adapted to detect a movement of an access window defined by a predetermined setup-time limit and a predetermined hold-time limit and to dynamically center said access window between said setup-time limit and said hold-time limit in response to said movement of said access window; and
- a second device operatively coupled to said first device, said second device to access data from said first device based upon said access window.

43. The computer system described in claim 42, wherein said controller comprises a dynamic access window unit for dynamically centering said access window, said dynamic access window unit further comprises:
- a pulse generator coupled to a clock input signal, said pulse generator adapted to provide a pulse for allowing the formation of a setup-time sensitive path and a hold-time sensitive path independent of a cycle time defined by said clock input signal;
- a variable delay unit operatively coupled to an output of said pulse generator and to a data input signal, said variable delay unit to provide a variable delayed clock output to generate said setup-time sensitive path and said hold-time sensitive path and to provide a delayed data output for latching said data output;
- a fixed delay unit operatively coupled to said variable delay unit, to generate said setup-time sensitive path and said hold-time sensitive path;
- an access window centering latch unit operatively coupled to said fixed delay unit, said access window centering latch unit adapted to provide a first code responsive to a setup-time violation and a second code responsive to a hold-time violation;
- a control decode unit operatively coupled to said access window centering latch unit, said control decode unit adapted to decode said first code and said second code to provide a delay control data;
- a delay control unit operatively coupled to said control decode unit, said delay control unit adapted to receive said delay control data and provide a variable delay signal to said variable delay unit to control said variable delay imposed upon said clock input signal and said data input signal; and
- an input latch operatively coupled to said variable delay unit, said input latch to provide latching of said delayed data output to provide a captured input signal.

44. The computer system described in claim 43, wherein said delay control unit comprises a register for generating said variable delay data.

45. The computer system described in claim 43, wherein said delay control unit comprises a counter for generating said variable delay data.

46. An apparatus, comprising:
- means for determining an access window defined by a setup-time and a hold-time;
- means for determining that said access window is not centered about a centerline, said centerline being a center point between a predetermined setup-time limit and a predetermined hold-time limit;
- means for performing a dynamic access window centering process in response to said determination that said access window is not centered about said centerline, said dynamic access window centering process comprising:
  - means for determining that said access window has shifted from said centerline, and means for providing at least one of a dynamic delay and a dynamic speed-up of said access window based upon said determination that said access window has shifted from said centerline.

47. A memory device for providing memory access, said memory device comprising a controller adapted to detect a movement of an access window defined by a predetermined setup-time limit and a predetermined hold-time limit and to dynamically center said access window between said setup-time limit and said hold-time limit in response to said movement of said access window.

48. The memory device described in claim 47, wherein said memory device is at least one of an SRAM device, a DRAM device, a DDR DRAM device, a RDRAM device, and a FLASH memory device.

49. The memory device described in claim 47, wherein said controller comprises a dynamic access window unit for dynamically centering said access window, said dynamic access window unit comprising:

a first matched input unit to receive at least one of a data input signal and an address input signal;

a pulse generator coupled to a clock input signal, said pulse generator adapted to provide a pulse for allowing the formation of a setup-time sensitive path and a hold-time sensitive path independent of a cycle time defined by said clock input signal;

a variable delay unit operatively coupled to an output of said pulse generator and to a data input signal, said variable delay unit to provide a variable delayed clock output to generate said setup-time sensitive path and said hold-time sensitive path and to provide a delayed data output for latching said data output;

a fixed delay unit operatively coupled to said variable delay unit, to generate said setup-time sensitive path and said hold-time sensitive path;

an access window centering latch unit operatively coupled to said fixed delay unit, said access window centering latch unit adapted to provide a first code responsive to a setup-time violation and a second code responsive to a hold-time violation;

a control decode unit operatively coupled to said access window centering latch unit, said control decode unit adapted to decode said first code and said second code to provide a delay control data;

a delay control unit operatively coupled to said control decode unit, said delay control unit adapted to receive said delay control data and provide a variable delay signal to said variable delay unit to control said variable delay imposed upon said clock input signal and to at least one of said data input signal and said address input signal; and an input latch operatively coupled to said variable delay unit, said input latch to provide latching of at least one of said delayed data input signal and said address input signal to provide a captured input signal.

50. The memory device described in claim 49, wherein said dynamic access window unit further comprising a second matched input unit operatively coupled to said variable delay unit, said second matched input unit being substantially matched with said first matched input unit and to receive at least one of a clock signal and a strobe signal provide a fixed-delay.

51. The memory device described in claim 50, wherein a first tuned path for said data input signal is defined by said first matched input unit, a first fixed-tuning delay buffer operatively coupled to said first matched input unit, said variable delay unit, and said input latch.

52. The memory device described in claim 50, wherein a second tuned path for said address input signal is defined by a third matched input unit, a second fixed-tuning delay buffer operatively coupled to said third matched input unit, a second variable delay unit operatively coupled to said third matched input unit, and a second input latch operatively coupled to second variable delay unit.

* * * * *

UNITED STATES PATENT AND TRADEMARK OFFICE
CERTIFICATE OF CORRECTION

PATENT NO. : 6,661,717 B1
DATED : December 9, 2003
INVENTOR(S) : Tyler J. Gomm and Aaron M. Schoenfeld It is certified that error appears in the above-identified patent and that said Letters Patent is hereby corrected as shown below:

Column 5,
Line 10, replace the word "re" with -- are --.

Column 6,
Line 14, after the word "store" insert the word -- data --.

Column 15,
Line 63, replace "predeter mined" with -- predetermined --.

Signed and Sealed this

Eleventh Day of May, 2004

JON W. DUDAS
*Acting Director of the United States Patent and Trademark Office*